United States Patent
Matsumura et al.

(10) Patent No.: US 9,488,687 B2
(45) Date of Patent: Nov. 8, 2016

(54) MULTIAXIAL MOTOR DRIVING APPARATUS AND MULTIAXIAL MOTOR DRIVE DEVICE FOR DETERMINING WHETHER OR NOT THERE IS A MISWIRING

(71) Applicant: Kabushiki Kaisha Yaskawa Denki, Kitakyushu-shi (JP)

(72) Inventors: Isamu Matsumura, Kitakyushu (JP); Toshinobu Kira, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 433 days.

(21) Appl. No.: 14/103,853

(22) Filed: Dec. 12, 2013

(65) Prior Publication Data

US 2014/0097859 A1 Apr. 10, 2014

Related U.S. Application Data

(63) Continuation of application No. PCT/JP2011/063619, filed on Jun. 14, 2011.

(51) Int. Cl.
*G01R 31/04* (2006.01)
*H02P 5/74* (2006.01)

(52) U.S. Cl.
CPC ............... *G01R 31/041* (2013.01); *H02P 5/74* (2013.01); *H02P 29/0241* (2016.02); *G05B 2219/42301* (2013.01)

(58) Field of Classification Search
CPC ... G01R 31/041; H02P 5/74; H02P 29/0241; G05B 2219/42301
USPC .................................................. 324/750.01
See application file for complete search history.

(56) References Cited

U.S. PATENT DOCUMENTS

| | | | |
|---|---|---|---|
| 5,825,150 A | 10/1998 | Kachi et al. | |
| 5,828,309 A | 10/1998 | Kumakura et al. | |
| 6,188,194 B1 | 2/2001 | Watanabe et al. | |
| 2002/0109423 A1 | 8/2002 | Jaenicke | |

FOREIGN PATENT DOCUMENTS

| | | |
|---|---|---|
| CN | 102064751 A | 5/2011 |
| DE | 19607688 A1 | 1/1997 |
| DE | 69614437 T2 | 5/2002 |
| DE | 10056146 A1 | 6/2002 |

(Continued)

OTHER PUBLICATIONS

International Search Report for PCT/JP2011/063619 dated Aug. 30, 2011.

(Continued)

*Primary Examiner* — Billy Lactaoen
(74) *Attorney, Agent, or Firm* — Hubbs, Enatsky & Inoue PLLC

(57) ABSTRACT

A multi-axis motor driving apparatus includes: a plurality of drivers individually connected to corresponding ones of the plurality of motors, for supplying electric power to the corresponding ones of the plurality of motors for driving; and an integrated controller for sequentially supplying electric power to the plurality of motors via the plurality of drivers, and based on detection signals of the encoders, determining for each driver whether or not there is miswiring of at least either of a motor wire that connects one of the plurality of drivers to one of the plurality of motors or a detector wire from the encoder.

12 Claims, 3 Drawing Sheets

(56) References Cited

FOREIGN PATENT DOCUMENTS

| | | |
|---|---|---|
| JP | 07-230319 A | 8/1995 |
| JP | 2000-032616 A | 1/2000 |
| JP | 2000-181521 A | 6/2000 |
| JP | 2003-348870 A | 12/2003 |
| JP | 2007-060864 A | 3/2007 |
| JP | 2009-165257 A | 7/2009 |
| JP | 2010-213557 A | 9/2010 |

OTHER PUBLICATIONS

Office Action for corresponding JP Application No. 2012-525780 dated Sep. 11, 2012.

The Office Action for corresponding Germany Patent Application No. 11 2011 105 542.0 dated Apr. 8, 2014 and the translation thereof.

The translation of the office action for corresponding Chinese Patent Application No. 201180071632.1, also acting as a supplemental concise explanation for previously submitted JP2003-348870A and JP2000-032616A.

MULTIAXIAL MOTOR DRIVING APPARATUS AND MULTIAXIAL MOTOR DRIVE DEVICE FOR DETERMINING WHETHER OR NOT THERE IS A MISWIRING

INCORPORATION BY REFERENCE

The present disclosure contains subject matter related to that disclosed in International Application No. PCT/JP2011/063619 filed on Jun. 14, 2011, the entire contents of which are hereby incorporated by reference.

BACKGROUND OF THE INVENTION

1. Field of the Invention

The disclosed embodiment relates to a multi-axis motor driving system for driving a plurality of motors each provided with a position detector, and to a multi-axis motor driving apparatus to be provided in the multi-axis motor driving system.

2. Description of the Related Art

Japanese Patent Application Laid-open No. 2000-181521 describes a control device for avoiding the risk due to abnormal operation of an automated machine including a plurality of servo-controlled axes immediately after the activation and thereby contributing to eliminating a cause of the abnormal operation. The control device includes forced energization interrupting means for forcibly interrupting energization to a servo amplifier at a predetermined time point after the energization to the servo amplifier is started and after a movement command is input to a servo controller.

In the above-mentioned conventional technology, the control device first simultaneously drives all axes in response to a movement command after the energization of servo amplifiers of all axes is turned on. Next, the control device stores internal data serving as abnormality determination indices for driving (latest torque command value (current command value), current feedback value, movement command value (integrated value), and position feedback value for each axis). Next, the control device repeats the driving and the storing until a predetermined time point arrives, and forcibly interrupts the energization of the servo amplifiers of all axes at the predetermined time point. Finally, the control device checks miswiring based on the stored internal data.

In the case where miswiring is checked based on the internal data stored when all the axes are simultaneously driven, the information volume of the internal data becomes larger as the number of axes becomes larger. Thus, many possible combinations of miswiring are present, and it may take time to accurately identify the miswiring.

The embodiments has been made in view of the above-mentioned problem, and it is an object of the embodiments to provide a multi-axis motor driving system and a multi-axis motor driving apparatus that are configured to identify a miswiring quickly and accurately.

SUMMARY OF THE INVENTION

In order to solve the above-mentioned problem, according to one aspect of the embodiments, there is provided a multi-axis motor driving system, including: a plurality of motors, each including a position detector; a host control device for outputting a motor control command; and a multi-axis motor driving apparatus for driving the plurality of motors based on the motor control command, in which the multi-axis motor driving apparatus includes: a plurality of drivers individually connected to ones of the plurality of motors corresponding thereto, for supplying electric power to ones of the plurality of motors corresponding thereto for driving; and a controller for sequentially supplying electric power to the plurality of motors via the plurality of drivers, and based on detection signals of the position detectors, determines for each driver whether or not there is miswiring of at least either of a motor wire that connects one of the plurality of drivers to one of the plurality of motors or a detector wire from one of a plurality of the position detector.

DESCRIPTION OF THE EMBODIMENTS

One embodiment is now described with reference to the accompanying drawings.

Figure 1:
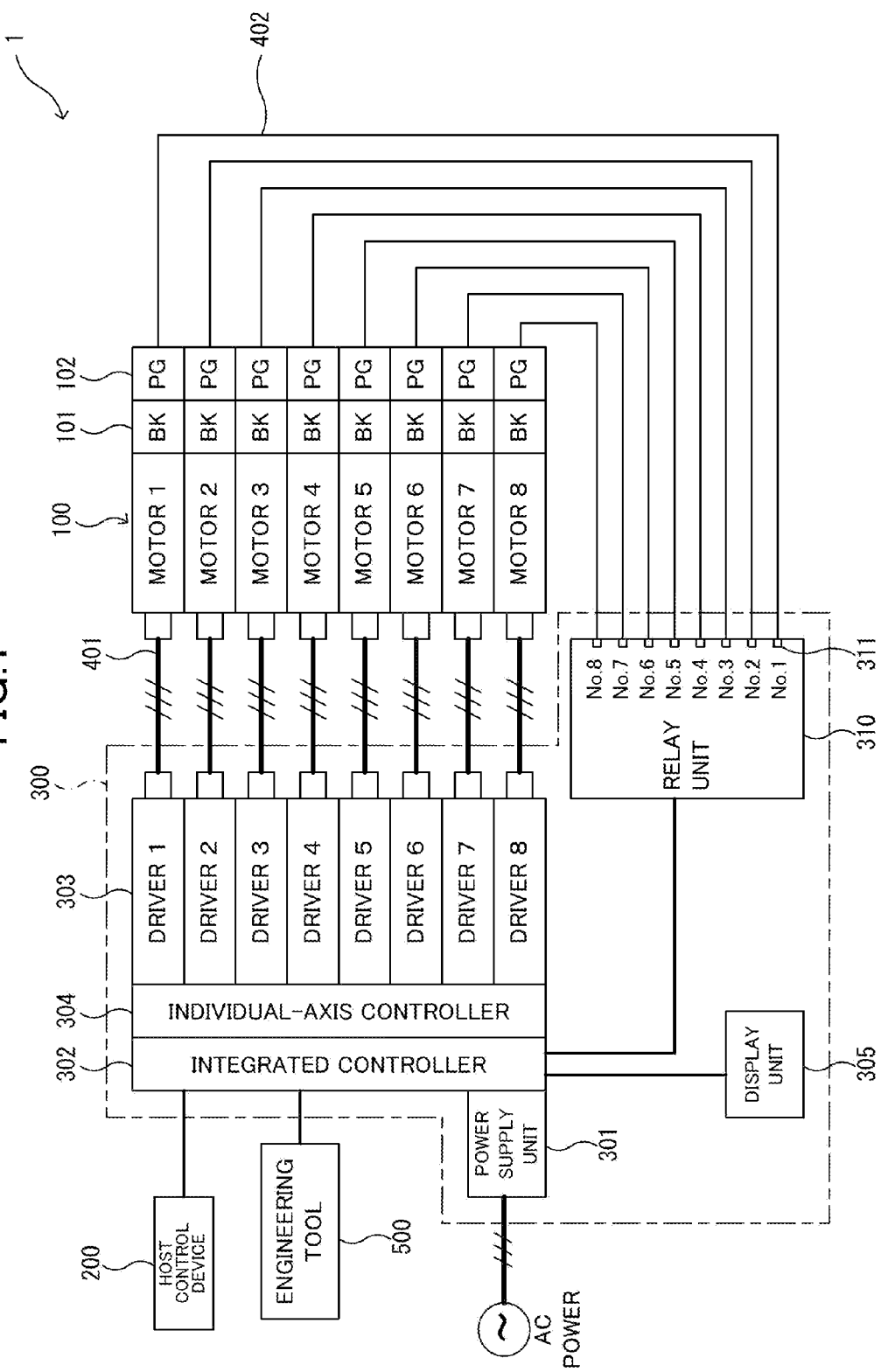
FIG. 1 is a system configuration diagram conceptually illustrating a configuration of a multi-axis motor driving system according to an embodiment.

FIG. 1 is a diagram illustrating a system configuration in which a multi-axis motor driving system 1 according to this embodiment is properly wired. As illustrated in FIG. 1, the multi-axis motor driving system 1 includes a plurality of (eight in this example) rotary motors 100, a host control device 200 for outputting a motor control command, and a multi-axis motor driving apparatus 300 for driving each motor 100 based on the motor control command of the host control device 200. Each motor 100 in this example is a three-phase AC motor, and includes a brake 101, and an encoder 102 (position detector) for detecting speed (angular speed) and position (angle) of a rotary axis and outputting the detection signal to the multi-axis motor driving apparatus 300 as a feedback pulse. Note that, the motor 100 does not have to include the brake 101.

The multi-axis motor driving apparatus 300 includes a power supply unit 301 to which AC power is input, an integrated controller 302 for controlling communications to/from the host control device 200 and controlling the overall multi-axis motor driving apparatus 300, a plurality of (eight in this example) drivers 303 individually connected to the corresponding motors 100 via motor wires 401, for supplying electric power to the motors 100 for driving, and an individual-axis controller 304 for controlling the plurality of drivers 303. Note that, the integrated controller 302 corresponds to an example of a controller as defined in "Claims".

The eight drivers 303 are hereinafter referred to as "first to eighth drivers 303" as appropriate, and the motors corresponding to each of the first to eighth drivers 303 are hereinafter referred to as "first to eighth motors 100". Further, the motor wires 401 that respectively connect the first to eighth drivers 303 to the first to eighth motors 100 corresponding thereto are referred to as "first to eighth motor wires 401" as appropriate.

The multi-axis motor driving apparatus 300 includes a relay unit 310 for relaying the positions detected by the encoders 102 to the integrated controller 302. The relay unit 310 is constructed of a board, a module, or the like, and is provided integrally with the multi-axis motor driving apparatus 300. Note that, the relay unit 310 may be constructed as a unit separated from the multi-axis motor driving apparatus 300. The relay unit 310 includes a plurality of (eight in this example) connectors 311 to be connected to encoder wires 402 from the encoders 102, and the respective connectors 311 correspond to the first to eighth motors 100. The connectors 311 respectively corresponding to the first to eighth motors 100 are hereinafter referred to as "first to eighth connectors 311". Further, the encoder wires 402 that respectively connect the encoders 102 of the first to eighth motors 100 to the first to eighth connectors 311 corresponding thereto are referred to as "first to eighth encoder wires 402" as appropriate. Note that, the multi-axis motor driving apparatus 300 does not have to include the relay unit 310, and the wires from the encoders 102 maybe connected directly to the integrated controller 302. The encoder wire 402 corresponds to an example of a detector wire as defined in "Claims".

The detection signals of the respective encoders 102 are input to the integrated controller 302 via the relay unit 310. The integrated controller 302 sequentially supplies electric power to the respective motors 100 via the respective drivers 303, and based on the detection signals of the encoders 102 output from the relay unit 310 at this time, determines for each driver 303 whether or not there is miswiring of at least either of the motor wire 401 that connects the driver 303 to the motor 100 or the encoder wire 402 from the encoder 102. As used herein, the miswiring of the motor wire 401 includes a case where there is miswiring of wires of the respective phases (U-phase, V-phase, W-phase) of the motor wire 401 (for example, a case where the corresponding phases are not connected between the driver 303 and the motor 100) and a case where there is miswiring which is a connection between a non-corresponding driver 303 and a motor 100 (for example, a case where the third driver 303 and the fourth motor 100 are connected to each other). Further, the miswiring of the encoder wire 402 includes a case where there is miswiring which is a connection between a non-corresponding encoder 102 and a connector 311 (for example, a case where the encoder 102 of the fifth motor 100 and the sixth connector 311 are connected to each other).

An engineering tool 500 is connected to the multi-axis motor driving apparatus 300. The engineering tool 500 is, for example, a portable handy controller or the like, and enables an operator to input various kinds of command, data and the like. The multi-axis motor driving apparatus 300 further includes a display unit 305, such as a liquid crystal panel. The display unit 305 displays various kinds of information including a determination result of the integrated controller 302. Note that, the multi-axis motor driving apparatus 300 does not have to include the display unit 305, and various kinds of indications may be given by a display device (for example, a PC display) externally provided or a display unit of the engineering tool 500.

Next, the contents of control executed by the integrated controller 302 in checking the wiring of the multi-axis motor driving system 1 are described with reference to FIG. 2. The integrated controller 302 starts the flow illustrated in FIG. 2, for example, when the multi-axis motor driving apparatus 300 is powered on. Note that, it is assumed that before the power is turned on, each motor wire 401 and each encoder wire 402 have been wired irrespective of whether there is miswiring or not. It is also assumed that the engineering tool 500 is connected in advance to the multi-axis motor driving apparatus 300 and is powered on.

In Step S5, the integrated controller 302 releases a brake function of the brakes 101 for all the motors 100 connected to the multi-axis motor driving apparatus 300.

In Step S10, the integrated controller 302 initializes a variable i for counting the number of drivers 303 to 0, and besides, sets i0 representing a total number of drivers to a predetermined value. In the example illustrated in FIG. 1, the number of drivers 303 is eight in total and hence i0=8. Note that, the value of i0 is manually input by the operator via the engineering tool 500. Alternatively, the number of drivers 303 connected to the integrated controller 302 may automatically be recognized at the time of power-on to determine the value of i0.

In Step S15, the integrated controller 302 selects one driver 303 from among the plurality of drivers 303 included in the multi-axis motor driving apparatus 300. For instance, in the example illustrated in FIG. 1, the drivers 303 are sequentially selected according to i, in a manner that the first driver 303 is selected in the case of i=0 and the second driver 303 is selected in the case of i=1.

In Step S20, the integrated controller 302 receives the detection signals from the relay unit 310 (detection signals of all the encoders 102), and based on the detection signals, stores the detection positions of all the encoders 102 connected to the connectors 311 of the relay unit 310 in a predetermined storage unit (such as a memory) as initial positions. The integrated controller 302 further outputs a servo-ON signal to the driver 303 selected in Step S15, and sets the driver 303 to a servo-ON state in which the corresponding motor 100 is positioned at its position of when the energization is started. In the servo-ON state, the integrated controller 302 outputs a position command corresponding to a drive amount of 0 to the driver 303, to thereby perform position loop control. Note that, the above-mentioned servo-ON state corresponds to an example of a first positioning control state as defined in "Claims".

In Step S25, the integrated controller 302 determines whether or not any of the motors 100 has been driven based on the detection signals from the relay unit 310 (detection signals of all the encoders 102). When any of the motors 100 has been driven (YES in Step S25), the flow proceeds to Step S30.

In Step S30, the integrated controller 302 determines whether or not the driven motor 100 is the motor corresponding to the driver 303 set to the servo-ON state in Step S20. When the motor 100 corresponding to the driver 303 set to the servo-ON state is driven (YES in Step S30), the flow proceeds to Step S35, and the integrated controller 302 determines that there is miswiring of the wires of the respective phases (U-phase, V-phase, W-phase) of the motor wire 401 for this motor 100. This determination is made as follows. In the servo-ON state, when the phase wires of the motor wire 401 are normal, the motor 100 is locked to its position of when the energization is started and the respective current phases mentioned above (U-phase, V-phase, W-phase) are input. However, when there is miswiring of the respective wires, the above-mentioned current phases (U-phase, V-phase, W-phase) are crossed, and the motor 100 may possibly be driven.

On the other hand, in Step S30, when the motor 100 that does not correspond to the driver 303 set to the servo-ON state is driven (NO in Step S30), the flow proceeds to Step S40, and the integrated controller 302 determines that the driver 303 and a motor 100 that does not correspond thereto are erroneously connected to each other or that the encoder 102 and a connector 311 that does not correspond thereto are erroneously connected to each other. This determination is made as follows. In the case where the drive of the motor 100 that does not correspond to the driver 303 set to the servo-ON state is detected, it is considered that the driver 303 and the motor 100 that does not correspond thereto are erroneously connected to each other if the encoder wire 402 is properly connected between the corresponding encoder 102 and the connector 311, and it is considered that the encoder 102 and a connector 311 that does not correspond thereto are erroneously connected to each other if the motor wire 401 is properly connected between the corresponding driver 303 and the motor 100.

After Step S35 or Step S40, the integrated controller 302 puts the control procedure to Step S45. In Step S45, the integrated controller 302 outputs a servo-OFF signal to the driver 303 that is set to the servo-ON state in Step S20 so that the driver 303 may enter a servo-OFF state, and turns on the brake function of the brakes 101 for all the motors 100 connected to the multi-axis motor driving apparatus 300. Note that, the servo-OFF state represents a state different from the above-mentioned servo-ON state: in other words, a state in which the energization to the motor 100 selected in Step S15 is forcibly stopped.

In next Step S50, the integrated controller 302 uses the display unit 305 to display information to prompt the operator to check the appropriate wire. For example, when it is determined that there is miswiring in Step S35, the integrated controller 302 displays information to prompt the operator to check the wires of the respective phases (U-phase, V-phase, W-phase) in the motor wire 401. When it is determined that there is miswiring in Step S40, the integrated controller 302 displays information to prompt the operator to check the motor wire 401 (whether or not a non-corresponding driver 303 and motor 100 are connected to each other) or the encoder wire 402. Then, the integrated controller 302 finishes this flow.

Note that, when none of the motors 100 has been driven in Step S25 (NO in Step S25), the flow proceeds to Step S55.

In Step S55, the integrated controller 302 outputs, via the individual-axis controller 304, a position command indicating a predetermined drive amount to the driver 303 that is set to the servo-ON state in Step S20, to thereby set the driver 303 to a positioning control state in which the corresponding motor 100 is positioned at a position more advanced by a predetermined drive amount than its position of when the energization is started. This positioning control state corresponds to an example of a second positioning control state as defined in "Claims". Note that, the above-mentioned predetermined drive amount is appropriately set to such a drive amount that does not hinder the operation of the load machine.

In Step S60, the integrated controller 302 receives the detection signals from the relay unit 310 (detection signals of all the encoders 102), and calculates a drive amount through comparison between the detection positions based on the detection signals and the initial positions stored in Step S20, to thereby determine whether or not the motor 100 corresponding to the driver 303 to which the position command is output in Step S55 has been driven normally by a drive amount corresponding to the position command. When the motor 100 that does not correspond to the driver 303 to which the position command is output is driven or when the motor 100 corresponding to the driver 303 to which the position command is output is driven but the drive amount thereof is not normal (NO in Step S60), the flow proceeds to Step S65.

In Step S65, the integrated controller 302 determines whether or not the motor 100 corresponding to the driver 303 to which the position command is output in Step S55 has been driven. When the motor 100 corresponding to the driver 303 to which the position command is output has abnormally driven (YES in Step S65), the flow proceeds to Step S70, and the integrated controller 302 determines that there is miswiring of the wires of the respective phases (U-phase, V-phase, W-phase) of the motor wire 401 of the motor 100 or that the encoder 102 and the connector 311 that does not correspond thereto are erroneously connected to each other. This determination is made as follows. If the wiring of the phase wires of the motor wire 401 are normal, the motor 100 is driven by a predetermined amount corresponding to the above-mentioned position command and then is stopped. However, if there is miswiring of the phase wires or the encoder wire 402, there may be a case where the drive amount is abnormal (including a case where the motor 100 is not driven). However, in the course of Step S60, Step S65, and Step S70 via Step S25, there is high possibility that the wiring of the respective phases (U-phase, V-phase, W-phase) of the motor wire 401 of the motor 100 can be determined as normal in Step S25, and hence there is a chance that miswiring verified in Step S70 can be identified as the case where there is miswiring of the encoder wire 402.

On the other hand, in Step S65, when the motor 100 that does not correspond to the driver 303 to which the position command is output is driven (NO in Step S65), the flow proceeds to Step S75, and the integrated controller 302 determines that the driver 303 and the motor 100 that does not correspond thereto are erroneously connected to each other or that the encoder 102 and the connector 311 that does not correspond thereto are erroneously connected to each other.

After that, similarly to the above, in Step S45, the integrated controller 302 sets the driver 303 that has been set to the servo-ON state in Step S20 to the servo-OFF state, and turns on the brake function of the brakes 101 for all the motors 100 connected to the multi-axis motor driving apparatus 300. Then, in Step S50, the integrated controller 302 uses the display unit 305 to display information prompting the operator to check an appropriate wire. Then, this flow is finished.

Note that, in Step S60, when the motor 100 corresponding to the driver 303 to which the position command is output in Step S55 is driven normally by the drive amount corresponding to the position command (YES in Step S60), the flow proceeds to Step S80.

In Step S80, the integrated controller 302 determines that there is no miswiring of the motor wire 401 or the encoder wire 402. In next Step S85, the integrated controller 302 uses the display unit 305 to display information indicating that the wires are properly routed.

In next Step S90, the integrated controller 302 increments the variable i by 1. Then, in next Step S95, the integrated controller 302 determines whether or not the variable i matches the total number of drivers i0. When the variable i and the total number of drivers i0 do not match each other (NO in Step S95), the flow returns to Step S15. In other words, processing of Step S15 to Step S95 is repeatedly executed for all the drivers 303 included in the multi-axis motor driving apparatus 300. When the variable i and the total number of drivers i0 match each other (YES in Step S95), on the other hand, this flow is finished. In the example illustrated in FIG. 1, the variable i and the total number of axes i0 match each other when the processing of Step S15 to Step S95 is executed for all the first to eighth drivers 303, and hence this flow is finished.

Figure 3:
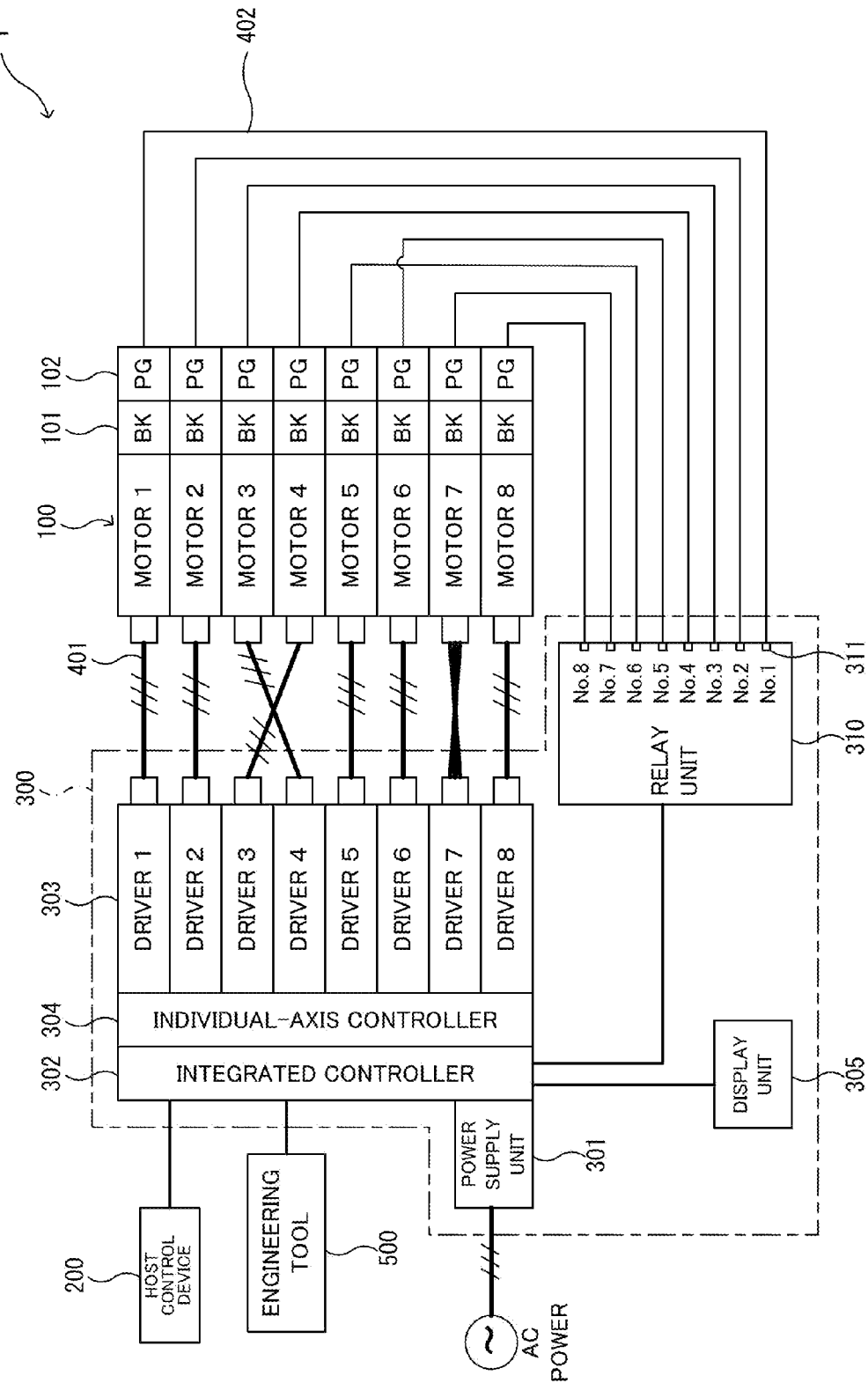
FIG. 3 is a system configuration diagram conceptually illustrating a configuration of the multi-axis motor driving system, illustrating an example of miswiring in the multi-axis motor driving system.

Next, a specific example of the miswiring that is verified by the above-mentioned control is described with reference to FIG. 3. In the example illustrated in FIG. 3, the third driver 303 and the fourth motor 100 are connected to each other, and the fourth driver 303 and the third motor 100 are connected to each other. Thus miswiring of the motor wires 401 which is a non-corresponding connection between the driver 303 and the motor 100 is created. Further, the corresponding phases are not connected between the seventh driver 303 and the seventh motor 100, and thus miswiring of the respective phases (U-phase, V-phase, W-phase) of the motor wire 401 is created. In addition, the encoder 102 of the fifth motor 100 and the sixth connector 311 are connected to each other, and the encoder 102 of the sixth motor 100 and the fifth connector 311 are connected to each other. Thus miswiring which is a non-corresponding connection between the encoder 102 and the connector 311 is created.

Figure 2:
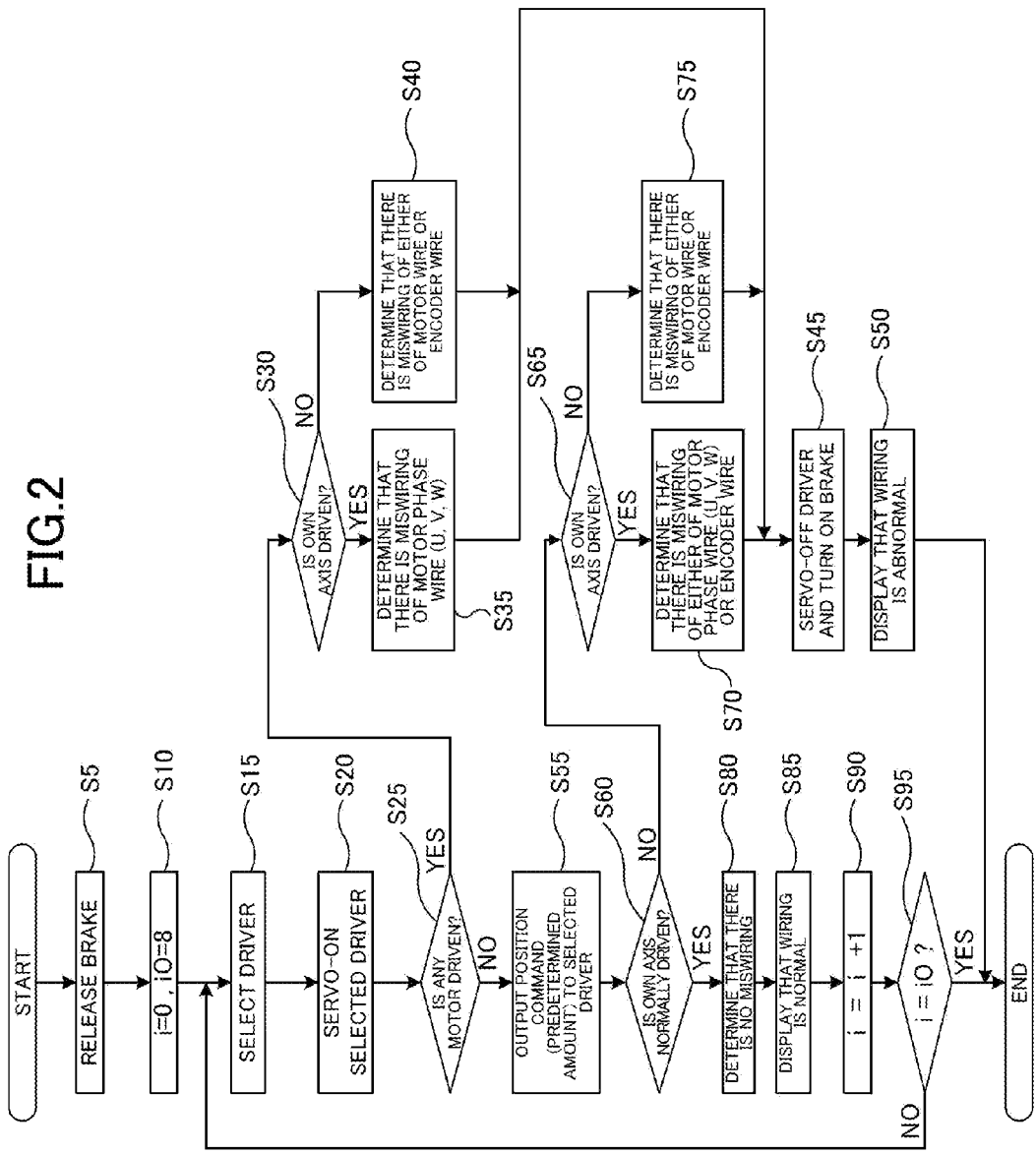
FIG. 2 is a flowchart illustrating the contents of control executed by an integrated controller in setting-up of the multi-axis motor driving system.

In the multi-axis motor driving system 1 having such miswiring, if the integrated controller 302 executes the contents of control illustrated in FIG. 2, it is determined that there is no miswiring for the first driver 303 and the second driver 303. For the third driver 303, because the third driver 303 and the fourth motor 100 are erroneously connected to each other, the fourth motor 100 may possibly be driven when the third driver 303 is set to the servo-ON state (Step S20). When the fourth motor 100 is driven, a detection signal is input from the encoder 102 of the fourth motor 100 to the fourth connector 311 of the relay unit 310 and is detected as the drive of the fourth motor 100. Accordingly, this state corresponds to the case where the motor 100 that does not correspond to the driver 303 set to the servo-ON state is driven (YES in Step S25, NO in Step S30), and hence it is determined that the third driver 303 and the fourth motor 100 are erroneously connected to each other or that the encoder 102 of the third motor 100 and the fourth connector 311 are erroneously connected to each other (Step S40). Then a message indicated so is displayed (Step S50). As a result, by checking the motor wire 401 and the encoder wire 402 corresponding to the third driver 303, the operator can find out that the third driver 303 and the fourth motor 100 are erroneously connected to each other because the encoder wire 402 is properly wired in this example.

Note that, even in the case where the fourth motor 100 is not driven at the time of setting the third driver 303 to the servo-ON state (NO in Step S25), when a position command indicating a predetermined drive amount is output to the third driver 303 (Step S55), a detection signal is input from the encoder 102 of the fourth motor 100 to the fourth connector 311 of the relay unit 310 and is detected as the drive of the fourth motor 100. Accordingly, this state corresponds to the case where the motor 100 that does not correspond to the driver 303 to which the position command is output is driven (NO in Step S60 and Step S65), and hence it is determined that the third driver 303 and the fourth motor 100 are erroneously connected to each other or that the encoder 102 of the third motor 100 and the fourth connector 311 are erroneously connected to each other (Step S75), and a message indicating so is displayed (Step S50). As a result, the operator can find out that the third driver 303 and the fourth motor 100 are erroneously connected to each other. Also for the fourth driver 303, the operator can similarly find out that the fourth driver 303 and the third motor 100 are erroneously connected to each other.

In regard to the fifth driver 303, on the other hand, the encoder 102 of the fifth motor 100 and the sixth connector 311 are erroneously connected to each other, and hence, if the fifth motor 100 is driven when the fifth driver 303 is set to the servo-ON state (Step S20), a detection signal is input from the encoder 102 of the fifth motor 100 to the sixth connector 311 of the relay unit 310 and is detected as the drive of the sixth motor 100. Accordingly, this state corresponds to the case where the motor 100 that does not correspond to the driver 303 set to the servo-ON state is driven (YES in Step S25, NO in Step S30), and hence it is determined that the fifth driver 303 and the sixth motor 100 are erroneously connected to each other or that the encoder 102 of the fifth motor 100 and the sixth connector 311 are erroneously connected to each other (Step S40), and a message indicating so is displayed (Step S50). As a result, by checking the motor wire 401 and the encoder wire 402 corresponding to the fifth driver 303, the operator can find out that the encoder 102 of the fifth motor 100 and the sixth connector 311 are erroneously connected to each other because the motor wire 401 is properly wired in this example.

Note that, also in the case where the fifth motor 100 is not driven at the time of setting the fifth driver 303 to the servo-ON state (NO in Step S25), when a position command indicating a predetermined drive amount is output to the fifth driver 303 (Step S55), a detection signal is input from the encoder 102 of the fifth motor 100 to the sixth connector 311 of the relay unit 310 and is detected as the drive of the sixth motor 100. Accordingly, this state corresponds to the case where the motor 100 that does not correspond to the driver 303 to which the position command is output is driven (NO in Step S60 and Step S65), and hence it is determined that the fifth driver 303 and the sixth motor 100 are erroneously connected to each other or that the encoder 102 of the fifth motor 100 and the sixth connector 311 are erroneously connected to each other (Step S75). Then, a message indicating so is displayed (Step S50). As a result, the operator can find out that the encoder 102 of the fifth motor 100 and the sixth connector 311 are erroneously connected to each other. Also for the sixth driver 303, the operator can similarly find out that the encoder 102 of the sixth motor 100 and the fifth connector 311 are erroneously connected to each other.

In regard to the seventh driver 303, on the other hand, the wires of the respective phases (U-phase, V-phase, W-phase) of the motor wire 401 are erroneously connected between the seventh driver 303 and the seventh motor 100, and hence, when the seventh driver 303 is set to the servo-ON state (Step S20), the seventh motor 100 may possibly be driven. When the seventh motor 100 is driven, a detection signal is input from the encoder 102 of the seventh motor 100 to the seventh connector 311 of the relay unit 310 and is detected as the drive of the seventh motor 100. Accordingly, this state corresponds to the case where the motor 100 corresponding to the driver 303 that is set to the servo-ON state is driven (YES in Step S25 and Step S30), and hence it is determined that there is miswiring of the wires of the respective phases of the motor wire 401 of the seventh motor 100 (Step S35), and a message indicating so is displayed (Step S50). As a result, the operator can find out that there is miswiring of the wires of the respective phases of the motor wire 401 of the seventh motor 100.

Note that, even in the case where the seventh motor 100 is not driven when the seventh driver 303 is set to the servo-ON state (NO in Step S25), if the seventh motor 100 is abnormally driven when a position command indicating a predetermined drive amount is output to the seventh driver 303 (Step S55), this state corresponds to the case where the motor 100 corresponding to the driver 303 to which the position command is output is driven but the drive amount thereof is not normal (NO in Step S60, YES in Step S65). Therefore, it is determined that there is miswiring of the wires of the respective phase of the motor wire 401 of the seventh motor 100 (Step S70), and a message indicating so is displayed (Step S50). In this manner, by performing the verification of miswiring in the servo-ON state of each driver 303 and thereafter performing the verification of miswiring in the state in which each driver 303 is driven by a predetermined amount, the verification of miswiring can be performed twice for each driver 303, thus enhancing the detection accuracy of miswiring.

In the multi-axis motor driving system 1 described above, the respective drivers 303 of the multi-axis motor driving apparatus 300 are individually connected to the corresponding motors 100 via the motor wires 401, and the encoders 102 of the respective motors 100 are individually connected to the connectors 311 of the relay unit 310 via the encoder wires 402. In such a system, a conceivable method of checking miswiring of the motor wire 401 and the encoder wire 402 is a method of repeatedly executing for a predetermined period of time the operation of simultaneously driving all the motors 100 and storing internal data serving as abnormality determination indices and thereby checking miswiring based on the stored internal data. In this case, however, the information volume of the internal data becomes larger as the number of axes becomes larger. Thus, many possible combinations of miswirings are present, and it may take time to accurately identify a miswiring.

In this embodiment, on the other hand, the integrated controller 302 of the multi-axis motor driving apparatus 300 sequentially supplies electric power to the respective motors 100 via the respective drivers 303, and, based on the detection signals of the encoders 102 at this time, verifies the presence/absence of miswiring of the motor wire 401 and the encoder wire 402 for each driver 303. By performing the verification for each driver 303 in this manner, the cause of miswiring can be limited to a portion of the wires corresponding to each driver 303 irrespective of the number of axes (that is, the number of drivers 303 or motors 100). With this configuration, the time required to accurately identify the miswiring can be shortened, and hence the cause of miswiring can be verified quickly and accurately. As a result, an abnormal operation of a load machine that may be caused by the miswiring can be suppressed in advance.

Particularly in this embodiment, the integrated controller 302 determines the presence/absence of miswiring based on the detection signal in a manner that each driver 303 is set to the servo-ON state. In the servo-ON state, the integrated controller 302 outputs a position command corresponding to a drive amount of 0 to the driver 303, to thereby perform position loop control. In this case, when each wiring is normal, the motor 100 is locked to its position of when the energization is started and the respective current phases (U-phase, V-phase, W-phase) are input. However, when there is miswiring of wires of the respective phases (U-phase, V-phase, W-phase) of the motor wire 401, the above-mentioned current phases (U-phase, V-phase, W-phase) are crossed, and the motor 100 may possibly be driven. Thus, when the drive of the motor 100 corresponding to the driver 303 subjected to positioning control is detected, it can be determined that there is miswiring of wires of the respective phases of the motor wire 401. On the other hand, when the drive of the motor 100 that does not correspond to the driver 303 subjected to positioning control is detected, it can be determined that there is miswiring of either of the motor wire 401 and the encoder wire 402 which is a connection between a non-compliant device and them. On the other hand, when it is verified that none of the plurality of motors 100 is driven, it can be determined that there is no miswiring.

Particularly in this embodiment, the integrated controller 302 determines the presence/absence of miswiring based on the detection signal in a manner that each driver 303 is set to the positioning control state in which the corresponding motor 100 is positioned at a position more advanced by a predetermined drive amount than its position of when the energization is started. In this case, when each wiring is normal, the motor 100 is driven by a predetermined amount and then is stopped. However, when there is miswiring of wires of the respective phases of the motor wire 401 or when there is miswiring of the encoder wire 402, the above-mentioned drive amount of the motor 100 may possibly be abnormal. Thus, when it is detected that the drive amount of the motor 100 corresponding to the driver 303 that is controlled to be driven by a predetermined amount is abnormal, it can be determined that there is miswiring of wires of the respective phases of the motor wire 401 of this motor 100 or that the encoder 102 and a connector 311 that does not correspond thereto are erroneously connected to each other. On the one hand, when the drive of the motor 100 that does not correspond to the driver 303 controlled to be driven by a predetermined amount is detected, it can be determined that there is miswiring of either of the motor wire 401 or the encoder wire 402 which is a connection between a non-compliant device and them. On the other hand, when it is detected that the drive amount of the motor 100 corresponding to the driver 303 that is controlled to be driven by a predetermined amount is normal, it can be determined that there is no miswiring. Further, by performing the verification of miswiring in the servo-ON state of each driver 303 and thereafter performing the verification of miswiring in the state in which each driver 303 is driven by a predetermined amount, the verification of miswiring can be performed twice for each driver 303, thus enhancing the detection accuracy of miswiring.

Particularly in this embodiment, the multi-axis motor driving apparatus 300 includes the display unit 305 for displaying the determination result of the integrated controller 302. With this configuration, if there is miswiring, a message indicating so is displayed on the display unit 305, thereby prompting the operator to check an appropriate wire and suppressing in advance an abnormal operation of a load machine that may be caused by the miswiring. Further, if there is no miswiring, a message indicating so is displayed on the display unit 305, thereby providing a feeling of security to the operator.

Note that, the embodiments are not limited to the above-mentioned embodiment, and various modifications are possible within the range not departing from the gist and technical concept thereof.

For example, although the case where the verification of miswiring is performed twice for each driver 303 by performing the verification of miswiring in the servo-ON state of each driver 303 and thereafter performing the verification of miswiring in the state in which each driver 303 is driven by a predetermined amount has been described above as an example, either of the verifications of miswiring may be dispensed with for each driver 303.

Further, although the case where the multi-axis motor driving system includes the rotary motor 100 has been described above as an example, the motor is not required to be a rotary motor, and a linear motor, for example, may be used. Also, the contents of control illustrated in FIG. 2 are executed by the integrated controller 302, but they may be executed by the individual-axis controller 304. Moreover, although the multi-axis motor driving system for 8-axis drive has been described above as an example, the number of axes is not limited thereto and may be changed as appropriate.

Further, although the case where the multi-axis motor driving apparatus 300 includes the display unit 305 has been described above as an example, the engineering tool 500 or the host control device 200 may include a display unit. In this case, the multi-axis motor driving apparatus 300 outputs information to be displayed to the engineering tool 500 or the host control device 200 with the use of means such as communications.

Further, configurations other than those already described above may be used by appropriately combining the methods described in the above-mentioned embodiment and respective modification examples.

Besides, although not exemplified in detail, the embodiments can be embodied with various changes within the range not departing from the gist thereof.

It should be understood by those skilled in the art that various modifications, combinations, sub-combinations and alterations may occur depending on design requirements and other factors insofar as they are within the scope of the appended claims or the equivalents thereof.

What is claimed is:

1. A multi-axis motor driving system, comprising:
   a plurality of motors, each comprising a position detector;
   a host control device for outputting a motor control command; and
   a multi-axis motor driving apparatus for driving the plurality of motors based on the motor control command,
   wherein the multi-axis motor driving apparatus comprises:
      a plurality of drivers individually connected to ones of the plurality of motors corresponding thereto, for supplying electric power to ones of the plurality of motors corresponding thereto for driving;
      a plurality of connectors individually connected to ones of the plurality of position detectors corresponding thereto, for receiving detection signals output from the plurality of position detectors; and
      a controller for determining for each of the plurality of drivers, based on the detection signals received by the plurality of connectors while sequentially supplying electric power to the plurality of motors via the plurality of drivers, whether or not there is miswiring, which is a conflict of a correspondence relation between the plurality of drivers and the plurality of connectors, and one or more of the plurality of connectors corresponding to the miswiring.

2. The multi-axis motor driving system according to claim 1, wherein the controller determines whether or not there is the miswiring of at least either of motor wires that connect the plurality of drivers to the plurality of motors or detector wires that connect the plurality of position detectors to the plurality of connectors, based on the detection signals obtained while a selected driver is set to a first positioning control state in which one of the plurality of motors corresponding thereto is positioned at its position when energization of it is started.

3. The multi-axis motor driving system according to claim 2, wherein, when the controller detects a drive of the corresponding one of the motors through one of the connectors corresponding to the selected one of the drivers set to the first positioning control state based on the detection signals, the controller determines that there is a miswiring or another miswiring of phase wires included in the motor wire of the corresponding one of the motors.

4. The multi-axis motor driving system according to claim 2, wherein, when the controller detects a drive of not one of the corresponding one of the motors through one of the connectors not corresponding to the selected one of the drivers set to the first positioning control state based on the detection signals, and the controller determines that there is the miswiring of either of the motor wires or the detector wires.

5. The multi-axis motor driving system according to claim 2, wherein, when the controller does not detect any of the plurality of motors to drive based on the detection signals, the controller determines that there is no miswiring of the motor wires or the detector wires.

6. The multi-axis motor driving system according to claim 1, wherein the controller determines whether or not there is the miswiring of at least either of motor wires that connect the plurality of drivers to the plurality of motors or detector wires that connect the plurality of position detectors to the plurality of connectors, based on the detection signals obtained while a selected driver is set to a positioning control state in which one of the plurality of motors corresponding thereto is positioned at a position more advanced by a predetermined drive amount than its position of when its energization is started.

7. The multi-axis motor driving system according to claim 6, wherein, when the controller detects that a drive amount of the corresponding one of the motors through one of the connectors corresponding to the selected one of the drivers set to the positioning control state is abnormal based on the detection signals, the controller determines that there is the miswiring of the detector wires or there is another miswiring of phase wires included in the motor wire of the corresponding one of the motors.

8. The multi-axis motor driving system according to claim 6, wherein, when the controller detects a drive of not one of the corresponding one of the motors through one of the connectors not corresponding to the selected one of the drivers set to the positioning control state based on the detection signals, the controller determines that there is the miswiring of either of the motor wires or the detector wires.

9. The multi-axis motor driving system according to claim 6, wherein, when the controller detects that a drive amount of the corresponding one of the motors through one of the connectors corresponding to the selected one of the drivers set to the positioning control state is normal based on the detection signals, the controller determines that there is no miswiring of the motor wires or the detector wires.

10. The multi-axis motor driving system according to claim 1, wherein the multi-axis motor driving apparatus further comprises a display unit for displaying a determination result of the controller.

11. A multi-axis motor driving apparatus comprising:
    a plurality of drivers individually connected to corresponding ones of the plurality of motors, for supplying electric power to the corresponding ones of the plurality of motors for driving;
    a plurality of connectors individually connected to ones of the plurality of position detectors corresponding thereto, for receiving detection signals output from the plurality of position detectors; and a controller for determining for each of the plurality of drivers, based on the detection signals received by the plurality of connectors while sequentially supplying electric power to the plurality of motors via the plurality of drivers, whether or not there is miswiring, which is a conflict of a correspondence relation between the plurality of drivers and the plurality of connectors, and one or more of the plurality of connectors corresponding to the miswiring.

12. A multi-axis motor driving apparatus comprising:
a plurality of drivers individually connected to corresponding ones of the plurality of motors, for supplying electric power to the corresponding ones of the plurality of motors for driving;
a plurality of connectors individually connected to ones of the plurality of position detectors corresponding thereto, for receiving detection signals output from the plurality of position detectors; and
control means for determining for each of the plurality of drivers, based on the detection signals received by the plurality of connectors while sequentially supplying electric power to the plurality of motors via the plurality of drivers, whether or not there is miswiring, which is a conflict of a correspondence relation between the plurality of drivers and the plurality of connectors, and one or more of the plurality of connectors corresponding to the miswiring.

* * * * *